(12) United States Patent
Shien

(10) Patent No.: US 7,240,273 B2
(45) Date of Patent: Jul. 3, 2007

(54) CYCLIC REDUNDANCY CHECK MODIFICATION FOR MESSAGE LENGTH DETECTION AND ERROR DETECTION

(75) Inventor: Shin-Lin Shien, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 502 days.

(21) Appl. No.: 10/844,382

(22) Filed: May 13, 2004

(65) Prior Publication Data
US 2005/0257118 A1    Nov. 17, 2005

(51) Int. Cl.
*H03M 13/15* (2006.01)
(52) U.S. Cl. .................................. 714/779; 714/781
(58) Field of Classification Search ............ 714/779, 714/781; H03M 13/15
See application file for complete search history.

(56) References Cited

U.S. PATENT DOCUMENTS 5,623,506 A * 4/1997 Dell et al. ................. 714/766

* cited by examiner

*Primary Examiner*—R. Stephen Dildine
(74) *Attorney, Agent, or Firm*—Finnegan, Henderson, Farabow, Garrett & Dunner, L.L.P.

(57) ABSTRACT

In a method for a variable-length communications system including encoding a message and decoding a data bit stream, the message includes a plurality of message blocks. A message block of the message is encoded by generating a parity check bit stream, flipping the parity check bit stream, and appending the flipped parity check bit stream to the end of the message block. When a data bit stream is received, a guessed message block and a guessed flipped parity check bit stream are extracted based on a guessed message block length. A parity check bit stream is generated for the guessed message block and then flipped. If the flipped parity check bit stream is the same as the guessed flipped parity check bit stream, the message block has been identified. Otherwise, the guessed message block length is increased by 1 and the above step is repeated.

17 Claims, 9 Drawing Sheets

CYCLIC REDUNDANCY CHECK MODIFICATION FOR MESSAGE LENGTH DETECTION AND ERROR DETECTION

FIELD OF THE INVENTION

This invention is in general related to a cyclic redundancy check method for message length detection in a variable-length communications system and, more particularly, to a modified cyclic redundancy check method that has a low false detection probability.

BACKGROUND OF THE INVENTION

In a digital communications system, such as a CDMA (Code Division Multiple Access) system, a data bit stream comprising a stream of binary bits representing a message is transmitted by a transmitter, travels through a data channel, and is received by a receiver. The data bit stream is generally composed of a number of message blocks. If the length of a message block is not fixed, the system may be referred to as a variable-length communications system. In such a variable-length system, additional length information of each message block is generally required for the receiver to identify each message block and extract the message from the received data bit stream. A conventional method of a variable-length communications system designates a separate channel as a control channel for transmitting length information of each message block. Thus, when the receiver receives both the length information and the data bit stream, the receiver identifies the corresponding message blocks based on the length information, and de-blocks the data bit stream.

The conventional method also generally utilizes cyclic redundancy check (CRC) bits for error detection purposes. In particular, a fixed number of CRC bits are appended to the end of each message block and have a predetermined relationship with the corresponding message block. The receiver receives both the message block and the CRC bits following that message block, and tries to re-establish the relationship therebetween. If the relationship is satisfied, the message block is considered without error. Otherwise, an error has occurred during the transmission of that block. This method is further explained in greater detail below.

First, a CRC generating polynomial, $g_l(x)$, of order l, is chosen. A common way of choosing the CRC generating polynomial is that $g_l(x)$ should satisfy $\gcd(g_l(x),x^i)=1$ for each and every i between 0 and l, inclusive, wherein l and i are integers, and the function $\gcd(A(x),B(x))$ is defined as the greatest common divider of polynomials $A(x)$ and $B(x)$. Examples of suitable $g_l(x)$ include $g_4(x)=x^4+x^3+x^2+x+1$ for l=4; $g_7(x)=x^7+x^6+x^4+1$ for l=7; $g_8(x)=x^8+x^7+x^4+x^3+x+1$ for l=8; and $g_{12}(x)=x^{12}+x^{11}+x^3+x^2+x+1$ for l=12. The information of CRC generating polynomial is stored in both the transmitter and the receiver.

For illustration purposes, a binary polynomial is defined for each binary bit stream as follows: if a binary bit stream A includes t binary bits, $a_{t-1}, a_{t-2}, \ldots, a_0$, wherein t is an integer, the binary polynomial of A is denoted as $A(x)$ and $A(x)=a_{t-1}x^{t-1}+a_{t-2}x^{t-2}+\ldots+a_0$. Also for illustration purposes, binary bit stream A is said to satisfy the CRC condition if $A(x)$ is divisible by $g_l(x)$. Two binary bit streams A and B are said to satisfy the CRC condition if $x^s A(x)+B(x)$ is divisible by $g_l(x)$, wherein s is the number of bits contained in bit stream B. It is well known to one skilled in the art that when, for example, a polynomial $A(x)$ is divisible by another polynomial $g_l(x)$, remainder of $A(x)$ divided by $g_l(x)$ is 0, and it may be said that $g_l(x)$ divides $A(x)$, denoted as $g_l(x)|A(x)$.

Next, for a message block M containing k bits of binary information, $m_{k-1}, m_{k-2}, \ldots, m_0$, a parity check bit stream P including l parity check bits, or CRC bits, $p_{l-1}, p_{l-2}, \ldots, p_0$, is generated such that M and P satisfy the CRC condition, or $g_l(x)|(x^l M(x)+P(x))$. A parity check bit stream may also be called a parity block, a parity check block, or a CRC block. For each message block M, it may be proved that there is only one corresponding parity check bit stream P. The proof is understood by one skilled in the art and is not discussed in detail herein.

According to the standard CRC method, parity check bit stream P may be generated using either hardware or software. Examples of hardware implementations are shown in FIGS. 1–2, and an example of a software implementation is shown in FIG. 3. Both FIGS. 1 and 2 assume l=8 and CRC generating polynomial $g_l(x)=x^8+x^7+x^4+x^3+x+1$.

FIG. 1 illustrates a first hardware implementation of generating parity check bit stream P. Referring to FIG. 1, a feedback shift register circuit 100 is used for generating parity check bit stream P based on CRC generating polynomial $g_l(x)=x^8+x^7+x^4+x^3+x+1$. Circuit 100 includes a plurality of delay circuits 102, which may be implemented as flip-flops. The number of delay circuits 102 is equal to the order of $g_l(x)$, i.e., l=8. Thus, in FIG. 1, there are 8 delay circuits, $102_1, 102_2, \ldots, 102_8$. Several XOR gates 104 are inserted between delay circuits 102. Each XOR gate 104 corresponds to a coefficient of CRC generating polynomial $g_l(x)$. For example, as shown in FIG. 1, an XOR gate $104_1$ to the left side of the first delay circuit $102_1$ indicates that the coefficient of $x^0=1$ of $g_l(x)$ is 1; the absence of XOR gate 104 between delay circuits $102_2$ and $102_3$ indicates that the coefficient of $x^2$ of $g_l(x)$ is 0; and an XOR gate $104_5$ between delay circuits $102_7$ and $102_8$ indicates that the coefficient of $x^7$ of $g_l(x)$ is 1. A clock signal (not shown) shifts register circuit 100 from left to right one bit at a time. Also shown in FIG. 1 is that the output of delay circuit $102_8$ is fed back to each of XOR gates $104_1$–$104_5$. The parity check bit stream P is generated by feeding into the left side of circuit 100 the message block M followed by eight bits of 0. The output of delay circuit $102_8$ then comprises message block M followed by its corresponding parity check bit stream P.

A second hardware implementation of generating parity check bit stream is illustrated in FIG. 2. Similarly, a feedback shift register circuit 200 includes a plurality of delay circuits 202, each of which may be implemented as a flip-flop circuit. Several XOR gates 204 are inserted between delay circuits 202 according to CRC generating polynomial $g_l(x)$. However, as compared to FIG. 1, an XOR gate 204 is added to the right end of circuit 200, rather than the left end of circuit 200, and the message block M is input into the rightmost XOR gate 204. A switch 206 switches the output of feedback shift register circuit 200 between message block M and the output of the rightmost XOR gate 204. Feedback shift register circuit 200 first outputs message block M and then outputs the parity bits by switching switch 206 to the output of the rightmost XOR gate 204.

FIG. 3 illustrates a software implementation of generating parity check bit stream P. Rather than generating the parity check bit stream P bit by bit, a lookup table is used in the software implementation. The lookup table contains an entire list of CRC bit streams for all possible messages of a certain length. For example, when l=8, the lookup table includes $2^8=256$ entries of CRC bit streams, each bit stream containing eight binary bits. As shown in FIG. 3, a message including 3 bytes (24 bits), Byte 1, Byte 2, and Byte 3, is encoded using the lookup table. At step 302, Byte 1 is considered and the lookup table is searched for a matching entry for Byte 1. An XOR operation is performed on the outcome of the search and Byte 2 at step 304 to generate an intermediate CRC bit stream CRC 2. An entry that matches CRC2 is looked up in the lookup table (step 306) and is XOR'ed with Byte 3 (step 308), to generate the CRC bit stream, CRC 3, of the message.

The above three implementations will be readily understood by one skilled in the art and, therefore, the details thereof are not further discussed herein.

After the parity check bit stream P is generated, the parity check bits thereof are appended to the end of the message block M to form a concatenated bit stream C including k+l bits, $m_{k-}, m_{k-2}, \ldots, m_0, p_{l-1}, p_{l-2}, \ldots, p_0$. In view of the above conditions, $g_l(x)$ divides $C(x)=x^l M(x)+P(x)$.

For each message block contained in the message, the above encoding process is repeated to generate a corresponding concatenated bit stream, and a data bit stream including the concatenated bit streams and length information of each message block are then transmitted through a data channel and a control channel, respectively.

At the receiver side, both the data bit stream and the length information are received. A received message block M' and a parity check bit stream P' are extracted based on the length information, wherein M' includes k bits, $m'_{k-1}, m'_{k-2}, \ldots, m'_0$, and P' includes l bits, $p'_{l-1}, p'_{l-2}, \ldots, p'_0$. The receiver then performs a so-called CRC test to determine if M' and P' satisfy the CRC condition. If the condition is satisfied, then the message block is received with no error.

A system using a separately designated control channel for transmitting length information as discussed above could be very inefficient when the data rate is slow. For example, in a standard UMTS (universal mobile telecommunications system) WCDMA (wideband code division multiple access) mode, AMR (Adaptive Multi-Rate) 12.2 kbps mode, the overhead for transmitting the length information may be as large as 3 kbps, or almost 25% of the total transmission rate of 12.2 kbps.

To reduce the overhead incurred by separately transmitting the length information, there has been proposed a CRC method (hereinafter "standard CRC method") that uses the CRC bits for message length detection, rather than transmitting the length information of each message block through a separate channel. According to the standard CRC method, the transmitter only transmits the data bit stream, and the receiver receives the data bit stream with no length information. Thus, the receiver may not directly identify the message blocks or extract the message. Instead, the receiver repeats a trial-and-error step to search the received data bit stream for a pair of message block and parity check bit stream that satisfy the CRC condition. First, the receiver guesses a number, for example, $\hat{k}$, as the block length, and treats the first $\hat{k}$ bits of the received bit stream as the message block, and the following l bits as parity check bit stream. The receiver then performs the CRC test to determine if the guessed message block and the guessed parity check bit stream satisfy the CRC condition. If the result is affirmative, the receiver has successfully identified a message block and continues to identify the next message block. Otherwise, the message block has not been identified, the guessed block length $\hat{k}$ is increased by 1, and the CRC test is repeated. Theoretically, after a few trials, the correct message block will be identified.

However, the standard CRC method has an inherent problem of probable false detection. Assuming a noise-free transmission and a uniformly distributed message, the probability of a false detection by the standard CRC method is given by Expression (1):

$$P_F(i) = \begin{cases} 0 & \text{for } i = 0; \\ 2^{-i}, & \text{for } 1 \leq i \leq l-1; \\ 2^{-l}, & \text{for } i \geq l, \end{cases} \quad (1)$$

wherein $i=k-\hat{k}$ is the message length offset. A brief explanation of Expression (1) is provided below.

Since the transmission is assumed noise-free, all the bits transmitted are received without error. Therefore, if $i=k-\hat{k}=0$, the CRC condition is satisfied and a correct message block is identified. No false detection occurs, i.e., $P_F(0)=0$.

If $i=k-\hat{k}=1$, the wrongly guessed message block M' includes k-1 bits, $m_{k-1}, m_{k-2}, \ldots, m_1$, and the guessed parity block P' includes l bits, $m_0, p_{l-1}, p_{l-2}, \ldots, p_1$. The CRC test therefore decides whether $g_l(x)$ divides $$C'(x) = x^l M'(x) + P'(x)$$
$$= m_{k-1} x^{l+k-2} + m_{k-2} x^{l+k-3} + \ldots + m_1 x^l + m_0 x^{l-1} +$$
$$p_{l-1} x^{l-2} + p_{l-2} x^{l-3} + \ldots + p_1.$$

Because $\gcd(g_l(x),x)=1$, deciding whether $g_l(x)|C'(x)$ is equivalent to deciding whether $g_l(x)|xC'(x)$. Comparing C'(x) with C(x), there is $xC'(x)=C(x)-p_0$. Thus, if $p_0=0$, because $g_l(x)|C(x)$, then $g_l(x)|xC'(x)$, and $g_l(x)|C'(x)$. The receiver regards the wrong message block M' as the correct message block, and there is a false detection. Otherwise, if $p_0=1$, the CRC condition is not satisfied, the receiver concludes that M' is not the correct message block, and there is no false detection. For a uniformly distributed message, the probability of $p_0=0$ is ½, and, therefore, the probability of a false detection is ½.

Similarly, if $1 < i \leq l-1$, the wrongly guessed message block M' includes k-i bits, $m_{k-1}, m_{k-2}, \ldots, m_i$, and the wrongly guessed parity block P' includes l bits, $m_{i-1}, m_{i-2}, \ldots, m_0, p_{l-1}, p_{l-2}, \ldots, p_i$. The CRC test therefore decides whether $g_l(x)$ divides $$C'(x) = x^l M'(x) + P'(x)$$
$$= m_{k-1} x^{l-i+k-1} + m_{k-2} x^{l-i+k-2} + \ldots + m_0 x^{l-i} +$$
$$p_{l-1} x^{l-i-1} + p_{l-2} x^{l-i-2} + \ldots + p_i.$$

Comparing C'(x) with C(x), there is $$x^i C'(x) = C(x) - \sum_{j=0}^{i-1} p_j(x).$$

Because the order of $g_i(x)$, l, is greater than i, $g_i(x)$ does not divide $$\sum_{j=0}^{i-1} p_j(x),$$

unless $p_0=p_1=\ldots=p_{i-1}=0$. Further because $g_i(x)|C(x)$, and $\gcd(g_i(x),x^i)=1$, $g_i(x)|C'(x)$ is satisfied only when $p_0=p_1=\ldots=p_{i-1}=0$. Thus, the probability of a false detection when $1<i\leq l-1$ is equal to the probability of $p_0=p_1=\ldots=p_{i-1}=0$, which, for a uniformly distributed message, is $2^{-i}$.

Finally, if $i\geq l$, the guessed message block M' includes k–i bits, $m_{k-1}, m_{k-2}, \ldots, m_i$, and the guessed CRC bit stream P' includes, $m_{i-1}, m_{i-2}, \ldots, m_{i-l}$. Since there is only one possible CRC bit stream that corresponds to M', the probability of P' satisfying the CRC condition of $g_i(x)|(x^i M'(x)+P'(x))$, i.e., the probability of a false detection, is $2^{-l}$ for a uniformly distributed message block.

FIG. 4 shows a simulation result of the probability of passing the CRC test for the standard CRC method with different guessed message lengths. The simulation conditions include that the order of the CRC generating polynomial is 8 and that the actual message length is 15. As shown in FIG. 4, as the estimated message size approaches the actual message length, i.e., the length offset i approaches 0, the probability of passing the CRC test increases exponentially.

In view of the large probability of false detection for a standard CRC method, a modified CRC method with a reduced probability of false detection has been proposed by NTT DoCoMo, Inc., and may be referred to as the DoCoMo's Modification of the CRC method. According to the DoCoMo's Modification, after the parity check bit stream P is generated, the parity check bits are appended to the message block in a reversed order, to form a concatenated bit stream, $m_{k-1}, m_{k-2}, \ldots, m_0, p_0, p_1, \ldots, p_{i-1}$. FIG. 5 shows simulation results for the DoCoMo's Modification as compared to the standard CRC method. The conditions are the same as those in FIG. 4, i.e., the order of the CRC generating polynomial is 8 and the actual message length is 15. As shown in FIG. 5, the probability of passing the CRC test, i.e., the probability of false detection is reduced to $2^{-l}$ for all message length offset i>0.

SUMMARY OF THE INVENTION

The present invention provides for a modified CRC method for message length detection having a low probability of false detection.

In accordance with the present invention, there is provided a method for a variable-length communications system, wherein messages to be transmitted are divided into variable-length message blocks. The method includes providing a cyclic redundancy check (CRC) generating polynomial, providing a binary flip polynomial, and encoding a message block of a message to be transmitted. The message block is encoded by generating a parity check bit stream using the CRC generating polynomial, flipping the parity check bit stream to generate a flipped parity check bit stream using the flip polynomial, and appending the flipped parity check bit stream to the end of message block to create a concatenated bit stream.

In accordance with the present invention, there is also provided a method for a variable-length communications system, wherein the system includes a receiver. The method includes storing in the receiver information of a cyclic redundancy check (CRC) generating polynomial and information of a flip polynomial, receiving a data bit stream including a plurality of concatenated bit streams, each concatenated bit stream consisting of a message block and a corresponding flipped parity check bit stream; and identifying a first message block in the data bit stream. The first message block is identified by (a) guessing a message block and a flipped parity check bit stream at the beginning of the data bit stream, (b) generating a parity check bit stream for the guessed message block using the CRC generating polynomial, (c) flipping the parity check bit stream using flip polynomial to generate a flipped parity check bit stream, and (d) if the flipped parity check bit stream and the guessed flipped parity check bit stream are different, increasing $\tilde{k}$ by 1 and repeating steps (a)–(c).

In accordance with the present invention, there is further provided a method for a variable-length communications system including encoding a message and decoding a data bit stream, wherein the message includes a plurality of message blocks. A message block of the message is encoded by generating a parity check bit stream, flipping the parity check bit stream, and appending the flipped parity check bit stream to the end of the message block. When a data bit stream is received, a guessed message block and a guessed flipped parity check bit stream are extracted based on a guessed message block length. A parity check bit stream is generated for the guessed message block and then flipped. If the flipped parity check bit stream is the same as the guessed flipped parity check bit stream, the message block has been identified. Otherwise, the guessed message block length is increased by 1 and the above step is repeated.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DESCRIPTION OF THE EMBODIMENTS

Figure 1:
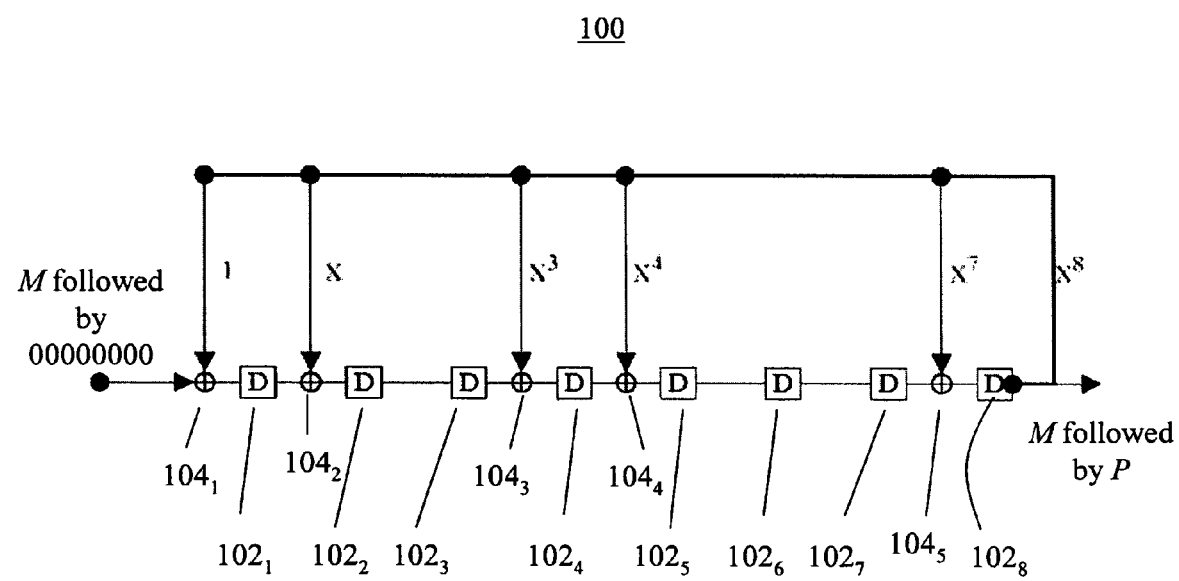
FIG. 1 illustrates a first hardware implementation of generating a parity check bit stream according to the standard CRC method.
Figure 2:
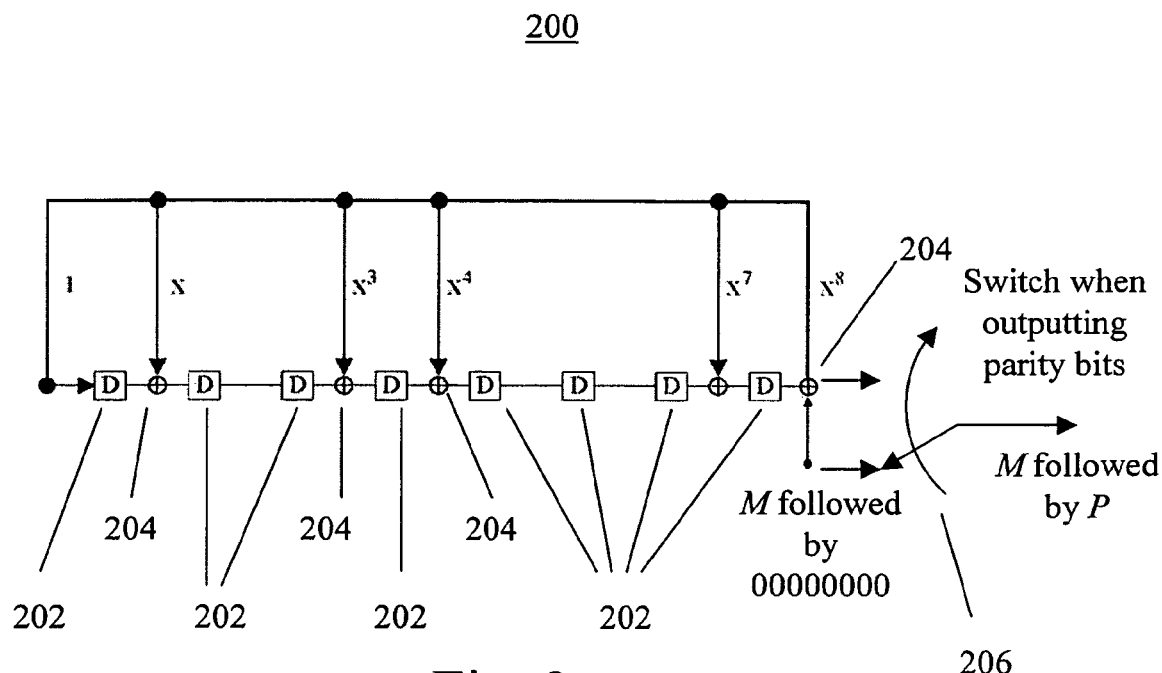
FIG. 2 illustrates a second hardware implementation of generating a parity check bit stream according to the standard CRC method.
Figure 3:
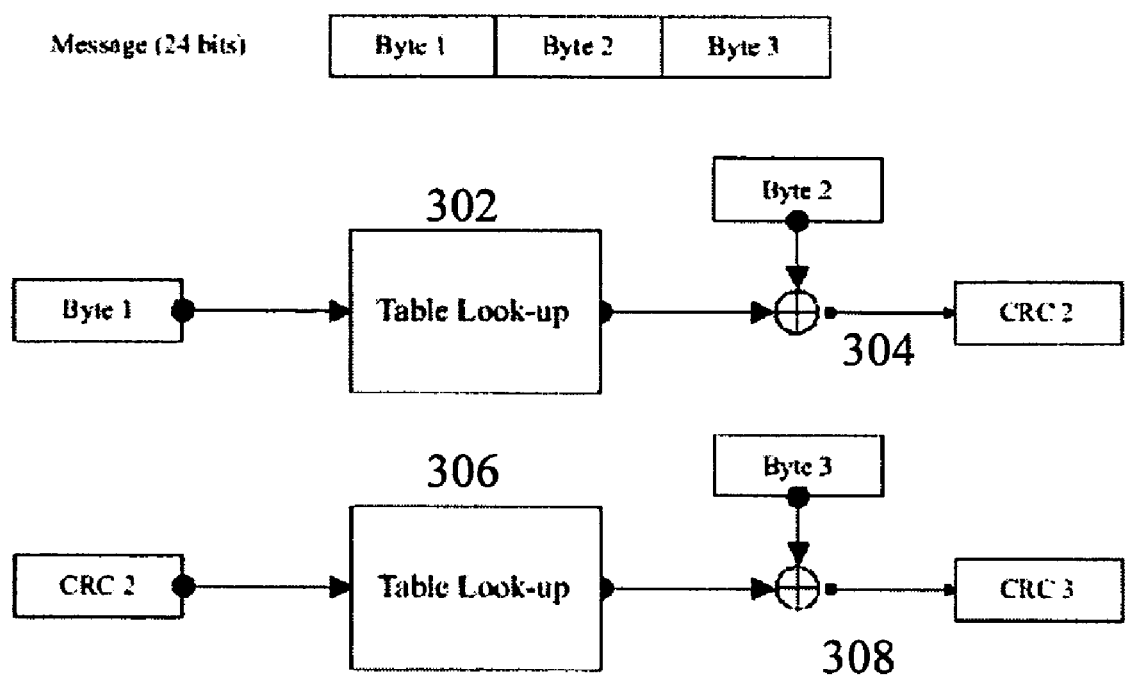
FIG. 3 illustrates a software implementation of generating a parity check bit stream according to the standard CRC method.
Figure 4:
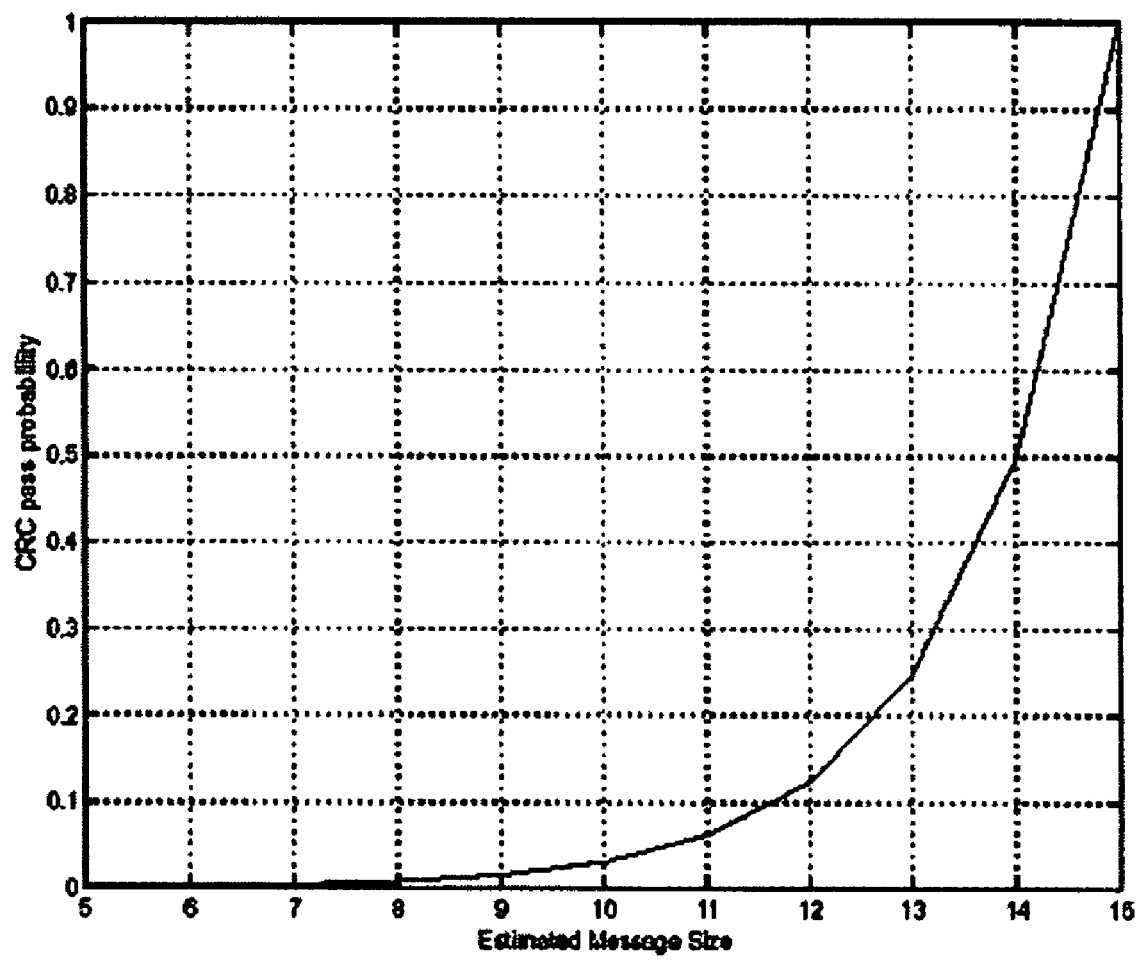
FIG. 4 shows simulation results of the standard CRC method.
Figure 5:
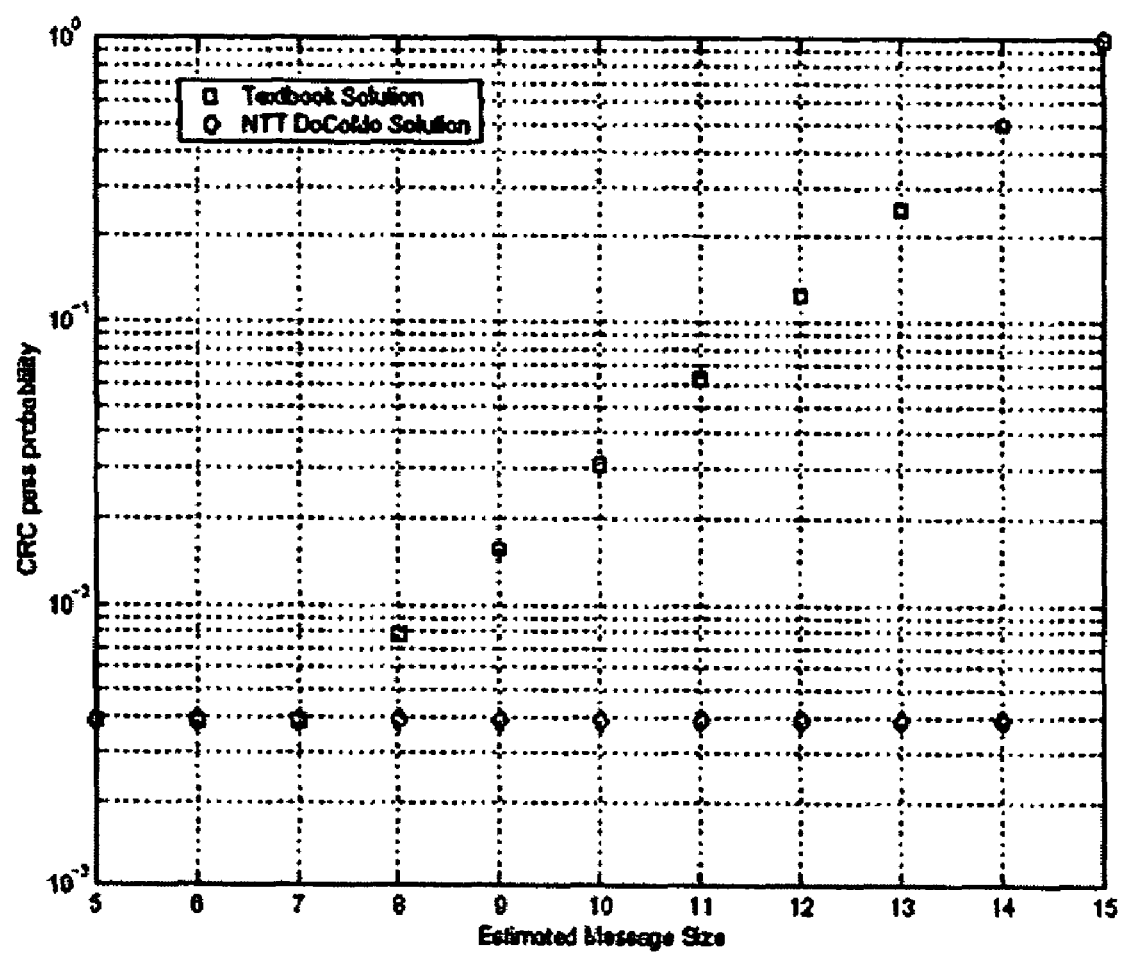
FIG. 5 shows simulation results of the DoCoMo Modification of the CRC method.

Reference will now be made in detail to preferred embodiments of the invention, examples of which are illustrated in the accompanying drawings. Wherever possible, the same reference numbers will be used throughout the drawings to refer to the same or like parts.

Embodiments consistent with the present invention provide a modified CRC method for message length detection having a low probability of false detection. More particularly, methods consistent with the present invention have a zero probability of false detection for any message length offset that is less than the number of CRC bits utilized in the system for each message block.

Methods consistent with the present invention are suitable for use in a variable-length communications system, which includes a transmitter and a receiver. A message to be transmitted may include a number of message blocks having non-fixed lengths. Each message block is encoded and transmitted by the transmitter. When the receiver receives the encoded message blocks, each message block is decoded and the message is extracted. Since the method of encoding and decoding is the same for all the message blocks, only one message block M including k bits, $m_{k-1}, m_{k-2}, \ldots, m_{k-1}, m_0$, is considered in the following description.

For illustration purposes, a binary polynomial is defined for each binary bit stream as follows: if a binary bit stream A includes t binary bits, $a_{t-1}, a_{t-2}, \ldots, a_0$, wherein t is an integer, the binary polynomial of A is denoted as A(x) and $A(x) = a_{t-1}x^{t-1} + a_{t-2}x^{t-2} + \ldots + a_0$. It is assumed that, unless otherwise indicated, hereinafter, when two binary polynomials are added, coefficients of the two polynomials corresponding to the same power are added according to a modulo-2 addition operation. A modulo-2 addition is defined as a binary addition with no carry, for example, 0+1=1, and 1+1=0. Thus, if bit stream B includes s binary bits, $b_{s-1}, b_{s-2}, \ldots, b_0$, then, assuming s<t, $$A(x)+B(x)=a_{t-1}x^{t-1}+a_{t-2}x^{t-2}+\ldots+a_sx^s+(a_{s-1}+b_{s-1})x^{s-1}+(a_{s-2}+b_{s-2})x^{s-2}+\ldots+(a_0+b_0),$$

wherein $a_i+b_i$ gives the result of modulo-2 addition of $a_i$ and $b_i$, for $0 \leq i \leq s-1$. It also assumed that, unless otherwise indicated, hereinafter, when two binary bit streams are added, the corresponding bits of the two bit streams are added according to modulo-2 addition operation. It is also well known to one skilled in the art that, according to the definition of modulo-2 addition, there are a+b+b=a, A+B+B=A, and A(x)+B(x)+B(x)=A(x), wherein a and b are binary bits, and A and B are binary bit streams.

A method consistent with the present invention starts by choosing two binary polynomials, a CRC generating polynomial (hereinafter "CRC polynomial"), $g_l(x)$, and a flip polynomial $f_l(x)$. CRC polynomial $g_l(x)$ has an order of l, and flip polynomial $f_l(x)$ has an order of l−1, wherein l is an integer. In one aspect, $gcd(g_l(x),x^i)=1$ for each and every $0 \leq i \leq l$, wherein i is an integer, and $gcd(g_l(x),x^i)$ is the greatest common divider of $g_l(x)$ and $x^i$. Examples of suitable $g_l(x)$ include $g_4(x)=x^4+x^3+x^2+x+1$ for l=4; $g_7(x)=x^7+x^6+x^4+1$ for l=7; $g_8(x)=x^8+x^7+x^4+x^3+x+1$ for l=8; and $g_{12}(x)=x^{12}+x^{11}+x^3+x^2+x+1$ for l=12. Flip polynomial $f_l(x)$ may be expressed as $f_l(x)=f_{l-1}x^{l-1}+f_{l-2}x^{l-2}+\ldots+f_0$, wherein $f_i \in \{0,1\}$ for $0 \leq i \leq l$. The coefficients of flip polynomial $f_l(x)$, namely, $f_{l-1}, f_{l-2}, \ldots, f_0$, may be referred to as flip bits. The information of CRC polynomial $g_l(x)$ and flip polynomial $f_l(x)$ is stored in both the transmitter and the receiver.

For illustration purposes, a binary bit stream A is said to satisfy the CRC condition if $g_l(x)$ divides A(x), or $g_l(x)|A(x)$; and two binary bit streams A and B are said to satisfy the CRC condition if $g_l(x)$ divides $x^sA(x)+B(x)$, or $g_l(x)|(x^sA(x)+B(x))$, wherein s is the number of bits contained in bit stream B.

On the transmitter side, an encoding process first generates a parity check bit stream P including l parity check bits, or CRC bits, $p_{l-1}, p_{l-2}, \ldots, p_0$, such that M and P satisfy the CRC condition, or $g_l(x)|(x^lM(x)+P(x))$, wherein $M(x)=m_{k-1}x^{k-1}+m_{k-2}x^{k-2}+\ldots+m_0$, and $P(x)=p_{l-1}x^{l-1}+p_{l-2}x^{l-2}+\ldots+p_0$. Parity check bit stream P may also be referred to as a parity check block, a parity block, or a CRC block. One skilled in the art will now appreciate that each message block M corresponds to only one unique parity check bit stream P.

The encoding process then flips the parity check bits according to flip polynomial $f_l(x)$, or, specifically, by performing a modulo-2 addition of each bit in the parity check bit stream P and a corresponding flip bit. The resultant flipped parity check bit stream $\overline{P}$ thus includes l flipped parity check bits: $\overline{p}_{l-1}=p_{l-1}+f_{l-1}, \overline{p}_{l-2}=p_{l-2}+f_{l-2}, \ldots, \overline{p}_0=p_0+f_0$. In effect, if $f_i=1$, then $\overline{p}_i$ is the flip of $p_i$; if $f_0=1$, then $\overline{p}_i$ is the same as $p_i$.

Then, the flipped parity check bits are appended to the end of the message block to form a concatenated bit stream C including k+l bits, $m_{k-1}, m_{k-2}, \ldots, m_0, \overline{p}_{l-1}, \overline{p}_{l-2}, \ldots, \overline{p}_0$.

Figure 6:
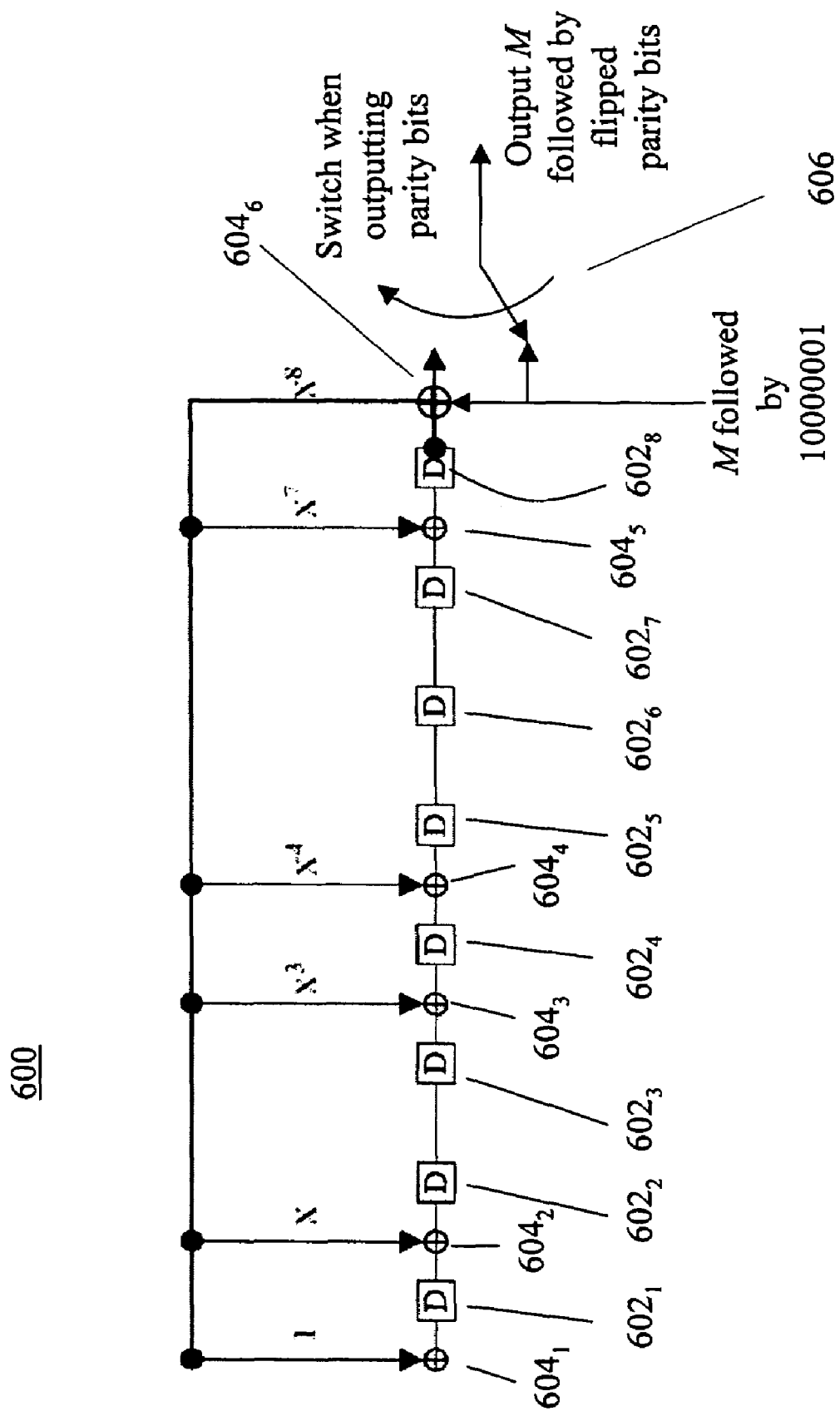
FIG. 6 illustrates a first hardware implementation of generating a flipped parity check bit stream according to the present invention.

Consistent with the present invention, the flipped parity check bits may be generated through hardware or software. FIG. 6 illustrates a first hardware implementation for generating the flipped parity check bits consistent with the present invention. Referring to FIG. 6, a feedback shift register circuit 600 is used for generating flipped parity check bit stream $\overline{P}$ based on CRC generating polynomial $g_l(x)=x^8+x^7+x^4+x^3+x+1$. Circuit 600 includes a plurality of delay circuits 602, which may be implemented as flip-flops. The number of delay circuits 602 is equal to the order of $g_l(x)$, i.e., l=8. Thus, in FIG. 6, there are 8 delay circuits, 602$_1$, 602$_2$, ..., 602$_8$. Several XOR gates 604 are inserted between delay circuits 602. Each XOR gate 604 corresponds to a coefficient of CRC generating polynomial $g_l(x)$. For example, as shown in FIG. 6, an XOR gate 604$_1$ to the left side of the first delay circuit 602$_1$ indicates that the coefficient of $x^0=1$ of $g_l(x)$ is 1; the absence of XOR gate 604 between delay circuits 602$_2$ and 602$_3$ indicates that the coefficient of $x^2$ of $g_l(x)$ is 0; and an XOR gate 604$_5$ between delay circuits 602$_7$ and 602$_8$ indicates that the coefficient of $x^7$ of $g_l(x)$ is 1. An XOR gate 604$_6$ is also coupled XOR the output of delay circuit 602$_8$ with the message block M followed by flip bits $f_{l-1}, f_{l-2}, \ldots, f_0$. According to the expression for $f_l(x)$ previously described and as shown in FIG. 6, $f_8(x)=x^7+1$. Thus, the corresponding 8 flip bits are 10000001. A clock signal (not shown) shifts register circuit 600 from left to right one bit at a time. Also shown in FIG. 6 is that the output of XOR gate 604$_6$ is fed back to each of XOR gates 604$_1$–604$_5$. A switch 606 switches the output of feedback shift register circuit 600 between message block M and the output of XOR gate 604₆. Feedback shift register circuit 600 first outputs message block M and then outputs the flipped parity bits by switching switch 606 to the output of XOR gate 604₆.

Figure 7:
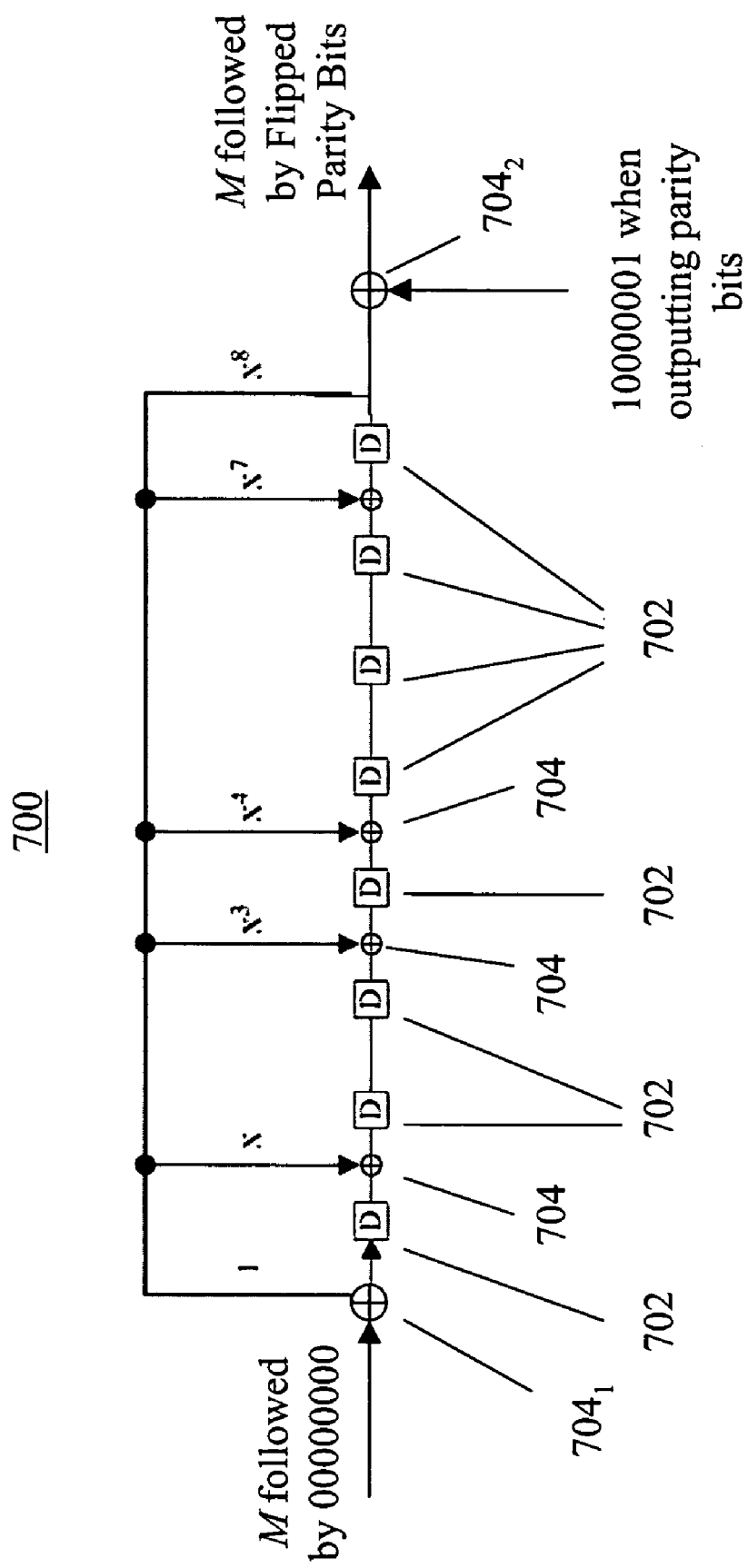
FIG. 7 illustrates a second hardware implementation of generating a flipped parity check bit stream according to the present invention.

A second hardware implementation for generating flipped parity check bit stream $\overline{P}$ consistent with the present invention is illustrated in FIG. 7. As shown in FIG. 7, a feedback shift register circuit 700 includes a plurality of delay circuits 702, each of which may be implemented as a flip-flop circuit. Several XOR gates 704 are inserted between delay circuits 702 according to CRC generating polynomial $g_l(x)$. Two XOR gates 704₁ and 704₂ are added to the left and right ends of circuit 700, respectively. The message block M is input into XOR gate 704₁, and the rightmost delay circuit 702 outputs message block M and its corresponding parity check bit stream P. XOR gate 704₂ then flips the parity check bit stream P using the flip bits, $f_{l-1}, f_{l-2}, \ldots, f_0$, to generate the flipped parity check bit stream $\overline{P}$. It is also assumed in FIG. 7 that the flip polynomial is $f_8(x) = x^7 + 1$, and therefore the flip bits are 10000001.

Figure 8:
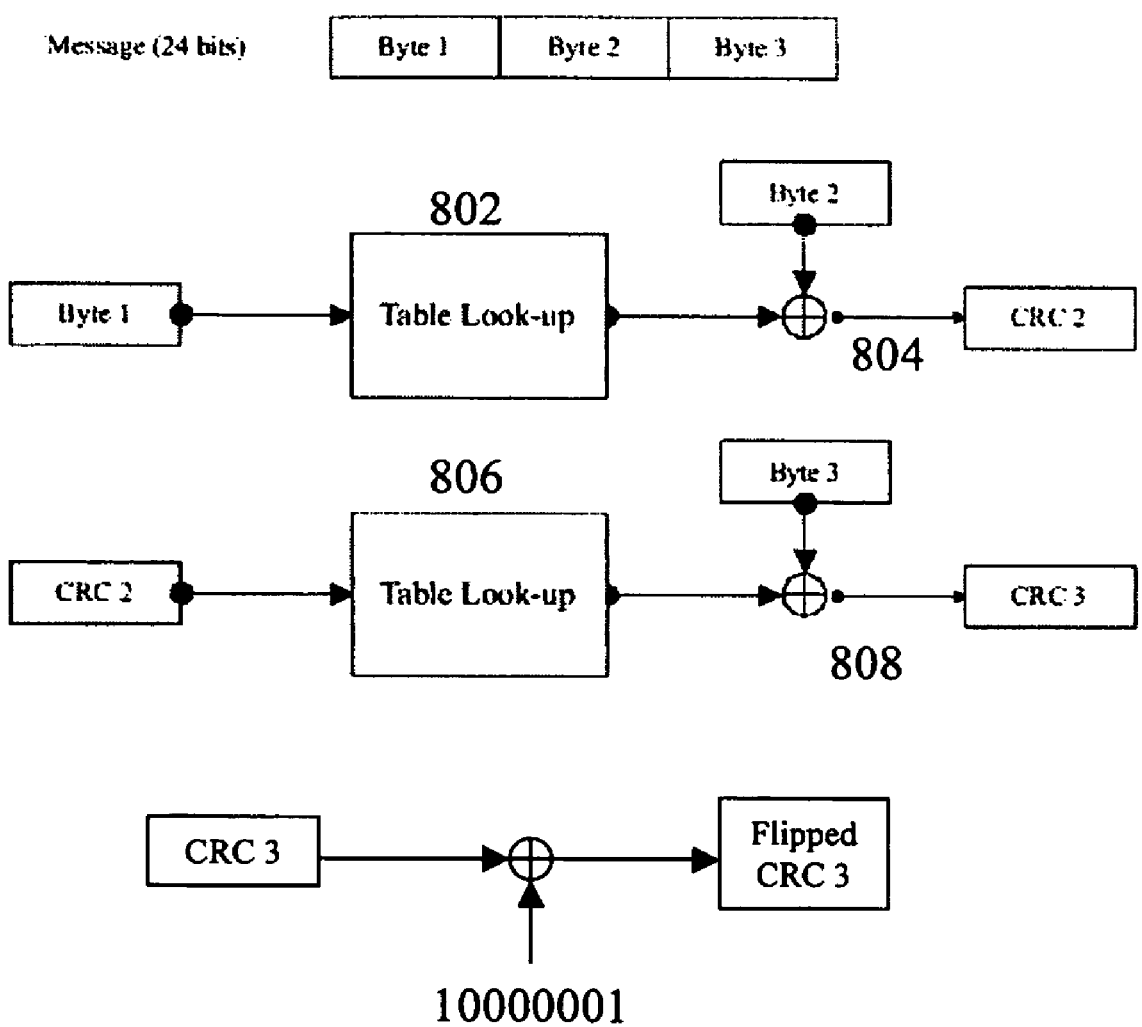
FIG. 8 illustrates a software implementation of generating a flipped parity check bit stream according to the present invention.

FIG. 8 diagrammatically illustrates a software implementation of generating flipped parity check bit stream $\overline{P}$, wherein a lookup table is used in the software implementation. The lookup table contains an entire list of CRC bit streams for all possible messages of a certain length. For example, when l=8, the lookup table includes $2^8=256$ entries of CRC bit streams, each bit stream containing eight binary bits. As shown in FIG. 8, a message including 3 bytes (24 bits), Byte 1, Byte 2, and Byte 3, is encoded using the lookup table. At step 802, Byte 1 is considered and the lookup table is searched for a matching entry for Byte 1. An XOR operation is performed on the outcome of the search and Byte 2 at step 804 to generate an intermediate CRC bit stream CRC 2. An entry that matches CRC2 is looked up in the lookup table (step 806) and is XOR'ed with Byte 3 (step 808), to generate the CRC bit stream, CRC 3, of the message. Further, CRC 3 is flipped using the flip bits. It is also assumed in FIG. 8 that the flip polynomial is $f_8(x) = x^7 + 1$, and therefore the flip bits are 10000001.

As discussed above and shown in FIGS. 6–8, the generation of the flipped parity check bits consistent with the present invention can be easily implemented. With the exception that the second hardware implementation as shown in FIG. 7 may have approximately the same complexity as a similar implementation of DoCoMo's modification, implementations of DoCoMo's modification are generally much more complex than those consistent with the present invention and the standard CRC method.

The same encoding process as above is performed to generate a concatenated bit stream for each of the other message blocks in the message, and a data bit stream including the resultant concatenated bit streams in series is transmitted.

When the receiver receives a data bit stream including at least one concatenated bit stream, a decoding process is performed to identify the first message block in the data bit stream. After the first message block is identified, the first message block and its corresponding flipped parity check bit stream are removed from the data bit stream, and the receiver continues to identify the first message block in the resultant data bit stream. Thus, when the receiver starts to decode message block M, the data bit stream includes $m_{k-1}, m_{k-2}, \ldots, m_0, \overline{p}_{l-1}, \overline{p}_{l-2}, \ldots, \overline{p}_0$, followed by the concatenated bit streams of the next message blocks.

Because the receiver does not know the actual length of message block M, a block length $\hat{k}$ is guessed. In one aspect, the initial value of $\hat{k}$ is chosen to be small enough to ensure $\hat{k} \leq k$. The receiver treats the first $\hat{k}$ bits in the bit stream, $m_{k-1}, m_{k-2}, \ldots, m_{k-\hat{k}}$, as constituting a message block M', and the following l bits, $m_{k-\hat{k}-1}, m_{k-\hat{k}-2}, \ldots, m_0, \overline{p}_{l-1}, \overline{p}_{l-2}, \ldots, \overline{p}_{k-\hat{k}}$, as constituting the corresponding flipped parity check bit stream $\overline{P'}$. The receiver then performs the CRC test as follows.

First, a parity check bit stream $\hat{P}$ including l parity check bits, $\hat{p}_{l-1}, \hat{p}_{l-2}, \ldots, \hat{p}_0$, is generated for the guessed message block M' such that $g_l(x) | (x^l M'(x) + \hat{P}(x))$. Second, using flip polynomial $f_l(x)$, the parity check bit stream $\hat{P}$ is flipped to generate a flipped parity check bit stream $\hat{P}'$, which includes l flipped parity check bits, $\hat{p}'_{l-1} = \hat{p}_{l-1} + f_{l-1}, \hat{p}'_{l-2} = \hat{p}_{l-2} + f_{l-2}, \ldots, \hat{p}'_0 = \hat{p}_0 + f_0$. Finally, the receiver compares the flipped parity check bit stream $\hat{P}'$ with the guessed flipped parity check bit stream $\overline{P'}$. If $\hat{P}' = \overline{P'}$, the CRC test is passed, it is considered that a message block has been correctly identified; the first $\hat{k}+l$ bits in the bit stream, i.e., message block M' and the flipped parity check bit stream $\overline{P'}$, are removed from the data bit stream; and the receiver continues to decode the first message block in the resultant data bit stream. Otherwise, if $\hat{P}' \neq \overline{P'}$, no message block has been identified, the estimated block length $\hat{k}$ is increased by 1, and the above test is repeated.

By choosing a proper flip polynomial $f_l(x)$, the CRC method of the present invention may have a low probability of false detection. In one aspect, flip polynomial $f_l(x)$ is chosen such that $$deg\left(\text{remainder of}\left(\frac{(1+x^i)f_l(x)}{g_l(x)}\right)\right) \geq i, \text{ for } 1 \leq i \leq l-1. \quad (2)$$

For example, when l=8 and $g_l(x) = x^8 + x^7 + x^4 + x^3 + x + 1$, a possible flip polynomial that satisfies condition (2) is $f_l(x) = x^7 + 1$.

Under condition (2) and the assumptions of an error-free transmission and a uniformly distributed message, CRC methods consistent with the present invention have a zero probability of false detection for any message length offset $i$ less than the number of CRC bits, $l$. In particular, the probability of false detection is given in Expression (3):

$$P_F(i) = \begin{cases} 0, & \text{for } 0 \leq i \leq l-1; \\ 2^{-i}, & \text{for } i \geq l, \end{cases}$$

if, and only if, $$deg\left(\text{remainder of}\left(\frac{(1+x^i)f_l(x)}{g_l(x)}\right)\right) \geq i, \text{ for } 1 \leq i \leq l-1, \quad (3)$$

wherein $i = k - \hat{k}$ is the message length offset. A brief proof of Expression (3) is given below.

When i=0, the guessed message block M' includes k bits, $M_{k-1}, m_{k-2}, \ldots, m_0$, and the corresponding flipped parity check block P' includes l bits, $\overline{p}_{l-1}, \overline{p}_{l-2}, \ldots, \overline{p}_0$. The correct message block is identified, CRC condition is satisfied, and there is no false detection.

For $1 \leq i \leq l$, the wrongly guessed message block M' includes k-1 bits, $m_{k-1}, m_{k-2}, \ldots, m_i$, and the wrongly guessed flipped parity check bit stream $\overline{P'}$ includes l bits, $m_{i-1}, m_{i-2}, \ldots, m_0, \overline{p_{l-1}}, \overline{p_{l-2}}, \ldots, \overline{p_i}$. The corresponding guessed parity check bit stream P' is the flip of $\overline{P'}$, or, $P'(x) = \overline{P'}(x) + f_l(x)$. The CRC test thus determines whether $g_l(x)|C'(x)$, wherein $$C'(x) = x^l M'(x) + P'(x)$$
$$= m_{k-1} x^{l+\hat{k}-1} + m_{k-2} x^{l+\hat{k}-2} + \ldots + m_0 x^{l-i} +$$
$$\overline{p_{l-1}} x^{l-i-1} + \ldots + \overline{p_i} + f_l(x).$$

Comparing C(x) with $C(x) = x^l M(x) + P(x)$, there is $$C(x) = (C'(x) + f_l(x)) x^i + \sum_{j=0}^{i-1} \overline{p_j} x^j + f_l(x).$$

Since $g_l(x)|C(x)$ and $\gcd(g_l(x), x^i) = 1$, $g_l(x)|C'(x)$ is satisfied if and only if $$g_l(x) \left| \left( (1 + x^i) f_l(x) + \sum_{j=0}^{i-1} \overline{p_j} x^j \right) \right.$$

But because $$deg\left( \sum_{j=0}^{i-1} \overline{p_j} x^j \right) < i,$$

and $$deg\left( \text{remainder of} \left( \frac{(1 + x^i) f_l(x)}{g_l(x)} \right) \right) \geq i$$

(condition (2) above), $$deg\left( \text{remainder of} \left( \frac{\left( (1 + x^i) f_l(x) + \sum_{j=0}^{i-1} \overline{p_j} x^j \right)}{g_l(x)} \right) \right) \geq i,$$

and $g_l(x)$ does not divide $$(1 + x^i) f_l(x) + \sum_{j=0}^{i-1} \overline{p_j} x^j.$$

Therefore, the probability of a false detection is 0 when $1 \leq i \leq l-1$ and $$deg\left( \text{remainder of} \left( \frac{(1 + x^i) f_l(x)}{g_l(x)} \right) \right) \geq i.$$

If $i \geq 1$, then the guessed message block M' includes k−i bits, $m_{k-1}, m_{k-2}, \ldots, m_i$, and the guessed flipped parity check block $\overline{P'}$ includes, $m_{i-1}, m_{i-2}, \ldots, m_{i-1}$. Because, as mentioned above, there is only one possible parity check block corresponding to a certain message block M', there is only one possible flipped parity check block that corresponds to message block M'. Therefore, assuming message block M is uniformly distributed, the probability of $m_{i-1}$, $m_{i-2}, \ldots, m_{i-l}$ composing the flipped check parity block $\overline{P'}$ that corresponds to M', i.e., the probability of a false detection, is $2^{-l}$.

Figure 9:
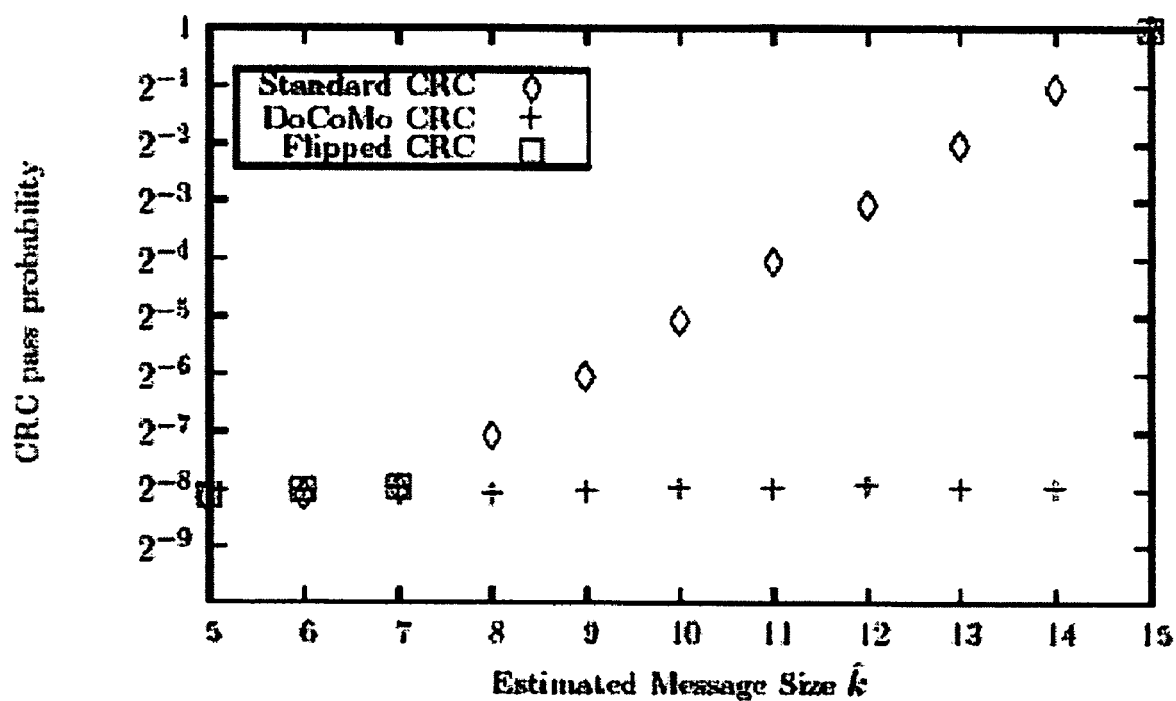
FIG. 9 shows simulation results of the present invention as compared to the standard CRC method and the DoCoMo's Modification method.

FIG. 9 shows a simulation result of the probability of passing the CRC test for the CRC method consistent with the present invention as compared to the standard CRC method and the DoCoMo's Modification method, wherein the diamond shape symbols represent the standard CRC method, the "+" symbols represent the DoCoMo's Modification method, and the square symbols represent the method consistent with the present invention. The order of the CRC generating polynomial is 8 and the actual message length is 15. Particularly, for the simulation shown in FIG. 9, $g_l(x) = x^8 + x^7 + x^4 + x^3 + x + 1$, and $f_l(x) = x^7 + 1$. As shown in FIG. 9, as the estimated message size approaches the actual message length, i.e., the length offset i approaches 0, the probability of passing the CRC test increases exponentially for the standard CRC method, and remains about the same (at $2^{-8}$) for the DoCoMo's Modification method. For the method consistent with the present invention, the probability of false detection is $2^{-8}$ when the message length offset is greater than or equal to 8 (i.e., the estimated message length is less than or equal to 7), and is 0 when the message length offset is less than 8. When the estimated message length is 15, i.e., the correct message block is identified, the probability of passing the CRC test is 1, and there is no false detection.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for a variable-length communications system, wherein messages to be transmitted are divided into variable-length message blocks, the method comprising:
   providing a cyclic redundancy check (CRC) generating polynomial $g_l(x)$, wherein l is an integer and is the order of $g_l(x)$;
   providing a binary flip polynomial $f_l(x)$ having an order of l−1, wherein $f_l(x) = f_{l-1} x^{l-1} + f_{l-2} x^{l-2} + \ldots + f_0$; and
   encoding a message block M of a message to be transmitted, wherein M includes k binary bits, $m_{k-1}$, $m_{k-2}, \ldots, m_0$, and wherein encoding M includes
   generating a parity check bit stream P, wherein P includes l parity check bits, $p_{l-1}, p_{l-2}, \ldots, p_0$, such that $g_l(x)|(x^l M(x) + P(x))$, wherein $M(x) = m^{k-1} x^{k-1} + m_{k-2} x^{k-2} + \ldots + m_0$, and $P(x) = p_{l-1} x^{l-1} + p_{l-2} x^{l-2} + \ldots + p_0$, flipping the parity check bit stream P to generate a flipped parity check bit stream $\overline{P}$ including l flipped parity check bits $\overline{p_{l-}}$, $\overline{p_{l-2}}$, ..., $\overline{p_0}$, such that $\overline{p_{l-1}}=p_{l-1}+f_{l-1}$, $\overline{p_{l-2}}=p_{l-2}+f_{l-2}$, ..., $\overline{p_0}=p_0+f_0$, wherein "+" is a modulo-2 addition operation, and appending the flipped parity check bit stream $\overline{P}$ to the end of message block M to create a concatenated bit stream C, such that C includes k+l bits, $m_{k-1}$, $m_{k-2}$, ..., $m_0$, $\overline{p_{l-1}}$, $\overline{p_{l-2}}$, ..., $\overline{p_0}$.

2. The method of claim 1, wherein CRC generating polynomial $g_l(x)$ is chosen such that $\gcd(g_l(x), x^i)=1$ for $0 \leq i \leq l$, wherein i is an integer.

3. The method of claim 1, wherein flip polynomial $f_l(x)$ is chosen such that $$deg\left(\text{remainder of}\left(\frac{(1+x^i)f_l(x)}{g_l(x)}\right)\right) \geq i,$$

for $1 \leq i \leq l-1$, wherein i is an integer.

4. The method of claim 1, further comprising repeating the encoding to create a concatenated bit stream for each message block of the messages to be transmitted and transmitting the concatenated bit streams in series.

5. A method for a variable-length communications system, wherein the system includes a receiver, the method comprising:

storing in the receiver information of a cyclic redundancy check (CRC) generating polynomial $g_l(x)$, wherein l is an integer and is the order of $g_l(x)$, and information of a flip polynomial $f_l(x)$ having an order of l-1;

receiving a data bit stream including a plurality of concatenated bit streams, each concatenated bit stream consisting of a message block and a corresponding flipped parity check bit stream; and identifying a first message block in the data bit stream, including (a) guessing a message block length $\hat{k}$ and a message block M' consisting of the first $\hat{k}$ bits in the data bit stream, $$m'_{\hat{k}-1}, m'_{\hat{k}-2}, \ldots, m'_0,$$

wherein $\hat{k}$ is an integer, and wherein l bits in the data bit stream that immediately follow the message block M' compose a guessed flipped bit stream P', (b) generating a parity check bit stream $\hat{P}$ including l parity check bits, $\hat{p}_{l-1}, \hat{p}_{l-2}, \ldots, \hat{p}_0$, such that $g_l(x)|(x^l M'(x) + \hat{P}(x))$, wherein $$M'(x) = m'_{\hat{k}-1}x^{\hat{k}-1} + m'_{\hat{k}-2}x^{\hat{k}-2} + \cdots + m'_0, \text{ and}$$

$$\hat{P}(x) = \hat{p}_{l-1}x^{l-1} + \hat{p}_{l-2}x^{l-2} + \cdots + \hat{p}_0,$$

(c) flipping the parity check bit stream $\hat{P}$ using flip polynomial $f_l(x)$ to generate a flipped parity check bit stream $\hat{P}'$ including l flipped parity check bits, $\hat{p}'_{l-1}, \hat{p}'_{l-2}, \ldots, \hat{p}'_0$, and (d) if P' and $\hat{P}'$ are different, increasing $\hat{k}$ by 1 and repeating (a)–(c).

6. The method of claim 5, wherein CRC generating polynomial $g_l(x)$ satisfies $\gcd(g_l(x), x^i)=1$ for $0 \leq i \leq l$, wherein i is an integer.

7. The method of claim 5, wherein flip polynomial $f_l(x)$ satisfies $$deg\left(\text{remainder of}\left(\frac{(1+x^i)f_l(x)}{g_l(x)}\right)\right) \geq i,$$

for $1 \leq i \leq l-1$, wherein i is an integer.

8. The method of claim 5, wherein the length of the first message block is k, wherein k is an integer, and the initial value of $\hat{k}$ is not greater than k.

9. The method of claim 5, wherein the flipped parity check bit stream $\hat{P}'$ is generated such that $$\hat{p}'_{l-1} = \hat{p}_{l-1} + f_{l-1}, \hat{p}'_{l-2} = \hat{p}_{l-2} + f_{l-2}, \ldots, \hat{p}'_0 = \hat{p}_0 + f_0,$$

wherein "+" is a modulo-2 addition operator.

10. The method of claim 5, wherein identifying the first message block further comprising removing the first $\hat{k}+l$ bits from the data bit stream when $P'=\hat{P}'$.

11. The method of claim 10, further comprising repeating identifying the first message block in the data bit stream after the first $\hat{k}+l$ bits are removed.

12. A method for a variable-length communications system, wherein the system includes a transmitter and a receiver, wherein messages are divided into variable-length message blocks, comprising:

providing a cyclic redundancy check (CRC) generating polynomial $g_l(x)$, wherein l is an integer and is the order of $g_l(x)$;

providing a binary flip polynomial $f_l(x)$ having an order of l-1;

storing in both the transmitter and the receiver information of CRC generating polynomial $g_l(x)$ and information of flip polynomial $f_l(x)$;

encoding a message to be transmitted by encoding each message block M thereof, wherein encoding M includes generating a parity check bit stream P using the CRC generating polynomial $g_l(x)$, flipping the parity check bit stream P to generate a flipped parity check bit stream $\overline{P}$ using flip polynomial $f_l(x)$, and appending the flipped parity check bit stream $\overline{P}$ to the end of the message block M to create a concatenated bit stream C; and transmitting the concatenated bit streams C of the message blocks M of the message to be transmitted;

receiving a data bit stream including a plurality of concatenated bit streams, each concatenated bit stream consisting of a message block and a corresponding flipped parity check bit stream; and decoding the data bit stream, including identifying a first message block in the data bit stream, including (a) guessing a message block length $\hat{k}$ and a message block M' consisting of the first $\hat{k}$ bits in the data bit stream, $$m'_{\hat{k}-1}, m'_{\hat{k}-2}, \ldots, m'_0,$$

wherein $\hat{k}$ is an integer, and wherein l bits in the data bit stream that immediately follow the message block M' compose a guessed flipped bit stream P',
(b) generating a parity check bit stream $\hat{P}$ using CRC generating polynomial $g_l(x)$,
(c) flipping the parity check bit stream $\hat{P}$ using flip polynomial $f_l(x)$ to generate a flipped parity check bit stream $\hat{P}'$,
(d) if P' and $\hat{P}'$ are different, increasing $\hat{k}$ by 1 and repeating (a)–(c), and
(e) removing the first $\hat{k}$+l bits from the data bit stream when P'=$\hat{P}'$, and
repeating the identifying of the first message block in the data bit stream after the first $\hat{k}$+l bits are removed.

13. The method of claim 12, wherein the CRC generating polynomial $g_l(x)$ is chosen such that $\gcd(g_l(x), x^i) = 1$ for $0 \leq i \leq l$, wherein i is an integer.

14. The method of claim 13, wherein the parity check bit stream $\hat{P}$ includes l bits, $\hat{p}_{l-1}, \hat{p}_{l-2}, \ldots, \hat{p}_0$, and is generated such that $g_l(x) | (x^l M'(x) + \hat{P}(x))$, wherein $$M'(x) = m'_{\hat{k}-1} x^{\hat{k}-1} + m'_{\hat{k}-2} x^{\hat{k}-2} + \ldots + m'_0,$$

and $$\hat{P}(x) = \hat{p}_{l-1} x^{l-1} + \hat{p}_{l-2} x^{l-2} + \ldots + \hat{p}_0.$$

15. The method of claim 12, wherein flip polynomial $f_l(x)$ is chosen such that $$deg\left(\text{remainder of } \left(\frac{(1+x^i) f_l(x)}{g_l(x)}\right)\right) \geq i,$$

for $1 \leq i \leq l-1$, wherein i is an integer.

16. The method of claim 15, wherein the parity check bit stream $\hat{P}$ includes l bits, $\hat{p}_{l-1}, \hat{p}_{l-2}, \ldots, \hat{p}_0$, wherein the flipped parity check bit stream includes $\hat{P}'$ including l flipped parity check bits, $$\hat{p}'_{l-1}, \hat{p}'_{l-2}, \ldots, \hat{p}'_0,$$

and wherein the flipped parity check bit stream $\hat{P}'$ is generated such that $$\hat{p}'_{l-1} = \hat{p}_{l-1} + f_{l-1}, \hat{p}'_{l-2} = \hat{p}_{l-2} + f_{l-2}, \ldots, \hat{p}'_0 = \hat{p}_0 + f_0,$$

wherein "+" is a modulo-2 addition operator.

17. The method of claim 12, wherein the length of the first message block in the data bit stream is k, wherein k is an integer, and the initial value of $\hat{k}$ is not greater than k.

* * * * *

UNITED STATES PATENT AND TRADEMARK OFFICE
Certificate

Patent No. 7,240,273 B2                                              Patented: July 3, 2007

On petition requesting issuance of a certificate for correction of inventorship pursuant to 35 U.S.C. 256, it has been found that the above identified patent, through error and without any deceptive intent, improperly sets forth the inventorship.
   Accordingly, it is hereby certified that the correct inventorship of this patent is: Shin-Lin Shien, Hsinchu (TW); Po-Ning Chen, Hsinchu (TW); and Yung-Hsiang Han, Taipei City (TW).

Signed and Sealed this Twenty-sixth Day of July 2011.

*Scott T. Baderman*
*Supervisory Patent Examiner*
*Art Unit 2114*
*Technology Center 2100*